United States Patent
Xing (10) Patent No.: US 10,204,542 B2
(45) Date of Patent: Feb. 12, 2019

(54) DRIVING DEVICE FOR DISPLAY PANEL AND DISPLAY DEVICE

(71) Applicant: Wuhan China Star Optoelectronics Technology Co., Ltd., Wuhan, Hubei (CN)

(72) Inventor: Zhenzhou Xing, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 211 days.

(21) Appl. No.: 15/123,669

(22) PCT Filed: Jul. 20, 2016

(86) PCT No.: PCT/CN2016/090656
§ 371 (c)(1),
(2) Date: Sep. 5, 2016

(87) PCT Pub. No.: WO2018/000485
PCT Pub. Date: Jan. 4, 2018

(65) Prior Publication Data
US 2018/0197456 A1     Jul. 12, 2018

(30) Foreign Application Priority Data
Jul. 1, 2016   (CN) .......................... 2016 1 0514942

(51) Int. Cl.
G09G 3/20     (2006.01)
H01L 27/12    (2006.01)
H01L 29/786   (2006.01)

(52) U.S. Cl.
CPC ......... G09G 3/2092 (2013.01); H01L 27/124 (2013.01); H01L 29/78696 (2013.01);
(Continued)

(58) Field of Classification Search
CPC ......... G09G 3/2092; G09G 2320/0233; G09G 2310/0297; G09G 2300/0426; H01L 27/124; H01L 29/78696
See application file for complete search history.

(56) References Cited

U.S. PATENT DOCUMENTS

2006/0163724 A1*  7/2006  Hwang .............. G02F 1/13452
                                                                257/737
2008/0001892 A1   1/2008  Kim et al.
(Continued)

FOREIGN PATENT DOCUMENTS

CN    104409037 A    3/2015
CN    104835473 A    8/2015

Primary Examiner — Ryan A Lubit
(74) Attorney, Agent, or Firm — Andrew C. Cheng (57) ABSTRACT

The present disclosure proposes a display and a display panel driving device. The display panel driving device includes a source driver chip having source driver signal output ports, a leads, each lead connected to one of the source driver signal output ports, and a multiplexer connected to the leads. The multiplexer is configured to transmit the source driver signal output by each of the leads to data lines on the display panel, and configured to adjust the strength of the source driver signal output by each of leads if the strength is not unanimous so that the source driver signals with a single strength enters the data lines. The display includes a display panel and the display panel driving device. Display uniformity of images shown on the panel is improved.

19 Claims, 4 Drawing Sheets

(52) U.S. Cl.
CPC ............... *G09G 2300/0426* (2013.01); *G09G 2310/0297* (2013.01); *G09G 2320/0233* (2013.01)

(56) References Cited

U.S. PATENT DOCUMENTS

| | | | |
|---|---|---|---|
| 2011/0128039 A1* | 6/2011 | Kim | ................ H03K 19/00384 326/30 |
| 2012/0081410 A1 | 4/2012 | Yeo et al. | |
| 2012/0268476 A1* | 10/2012 | Park | ................... G09G 3/3607 345/589 |
| 2014/0085173 A1 | 3/2014 | Dong et al. | |
| 2015/0015553 A1 | 1/2015 | Cho et al. | |
| 2015/0091849 A1* | 4/2015 | Ludden | ................ G06F 3/0412 345/174 |
| 2015/0177546 A1 | 6/2015 | Wu | |
| 2017/0139534 A1 | 5/2017 | Hao | |
| 2017/0323606 A1 | 11/2017 | Wang et al. | |
| 2018/0130426 A1 | 5/2018 | Xing et al. | |

\* cited by examiner

DRIVING DEVICE FOR DISPLAY PANEL AND DISPLAY DEVICE

BACKGROUND OF THE INVENTION

1. Field of the Invention

The present invention relates to the field of display technology, and more particularly, to a display panel driving device and a display device.

2. Description of the Prior Art

To fulfill the tendency of a thinned cellphone using a narrow bezel, a small and medium-sized panel comprises a gate driver on array (GOA) plus a driver chip; that is, the gate driver is integrated onto a display zone. So a source driver chip in charge of a data signal is bonded on the non-display zone.

Figure 1:
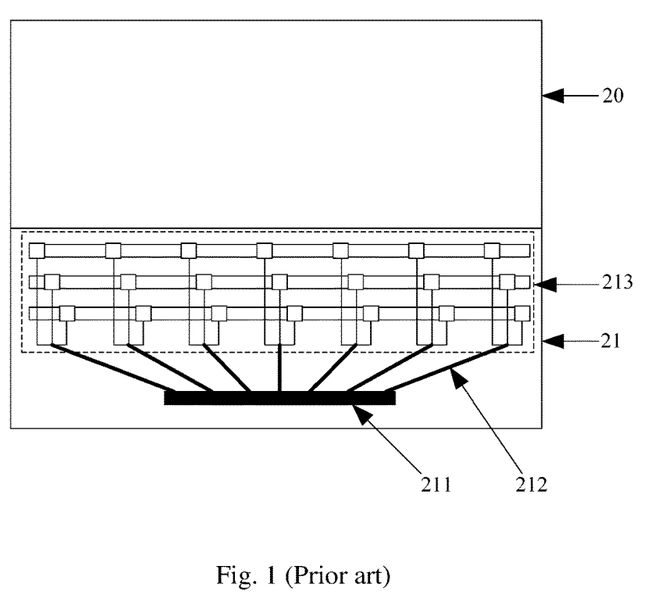
FIG. 1 is a schematic diagram of the structure of a conventional display device.

FIG. 1 is a schematic diagram of the structure of a conventional display device. The conventional display device comprises a display panel 20 and a display panel driving device 21. The display panel driving device 21 comprises a source driver chip 211, a lead 212, and a multiplexer 213. The source driver chip 211 is connected to a data line through a set of sectoral conductors. The set of sectoral conductors comprise a plurality of leads 212. Each of the plurality of leads 212 is connected to the multiplexer 213. Also, the multiplexer 213 is connected to a data line on the display panel 20. Accordingly, a source driver signal through each of the plurality of leads 212 is transmitted to the plurality of data lines.

In the conventional display panel driving device, an arrangement of sectoral conductor area looks like a sector. The length of the lead 212 at the two terminals of the sectoral conductor area is longer than the length of the lead 212 at the middle of the sectoral conductor area. The cross-sectional area of the lead 212 is the same, and the material of the lead 212 is the same, so the impedance of the lead 212 at the two terminals is greater than that of the lead 212 at the middle. However, the waveform of the source driver signal transmitted through the lead 212 at the two terminals is seriously distorted, which affects uniformity of the source driver signal, display quality of the display panel, and a poorer display effect.

SUMMARY OF THE INVENTION

A display panel driving device and a display device are proposed by the present invention to solve the problem that the display effect is poor due to discrepancy of display images in the conventional technology.

According to the present invention, a display panel driving device comprises: a source driver chip, comprising a plurality of laterally arranged source driver signal output ports, and being configured to output a source driver signal; a plurality of leads, distributed like a sector; each of the plurality of leads being connected to a source driver signal output port; the length of the lead becoming gradually longer from the middle to two terminals of the plurality of laterally arranged leads; a multiplexer, connected to a plurality of leads, being configured to transmit the source driver signal output by each of the plurality of leads to a plurality of data lines on the display panel, and being configured to adjust the strength of the source driver signal output by each of the plurality of leads if the strength is not unanimous so that the source driver signals with a single strength enters the plurality of data lines. The multiplexer comprises a plurality of laterally arranged switch sets, and each of the plurality of leads is connected to one of the plurality of switch sets; each of the plurality of switch sets comprises a plurality of laterally arranged TFT switches, each of the plurality of TFT switches is connected to one data line on the display panel so that the source driver signal passes through each of the plurality of leads to the plurality of data lines; the conductivity of each of the plurality of TFT switches in each of the plurality of switch sets is equal; the ratio of width/length of a channel of the TFT switch of the switch set gradually enlarges from the middle to the two terminals of the plurality of laterally arranged switch sets; the conductivity of the switch set linearly strengthens from the middle to the two terminals of the plurality of laterally arranged switch sets, so that the strength of the source driver signal passing through each of the plurality of data lines in the display panel is equal.

According to the present invention, a display panel driving device comprises: a source driver chip, comprising a plurality of laterally arranged source driver signal output ports, and being configured to output a source driver signal; a plurality of leads, distributed like a sector; each of the plurality of leads being connected to a source driver signal output port; the length of the lead becoming gradually longer from the middle to two terminals of the plurality of laterally arranged leads; a multiplexer, connected to a plurality of leads, being configured to transmit the source driver signal output by each of the plurality of leads to a plurality of data lines on the display panel, and being configured to adjust the strength of the source driver signal output by each of the plurality of leads if the strength is not unanimous so that the source driver signals with a single strength enters the plurality of data lines.

Furthermore, the multiplexer comprises a plurality of laterally arranged switch sets, and each of the plurality of leads is connected to one of the plurality of switch sets; each of the plurality of switch sets comprises a plurality of laterally arranged TFT switches, each of the plurality of TFT switches is connected to one data line on the display panel so that the source driver signal passes through each of the plurality of leads to the plurality of data lines; the conductivity of each of the plurality of TFT switches in each of the plurality of switch sets is equal; the conductivity of the switch set strengthens from the middle to the two terminals of the plurality of laterally arranged switch sets so that the strength of the source driver signal passing through each of the plurality of data lines in the display panel is equal.

Furthermore, the ratio of width/length of a channel of the TFT switch of the switch set gradually enlarges from the middle to the two terminals of the plurality of laterally arranged switch sets.

Furthermore, the length of the channel of the TFT switch of each of the plurality of switch sets is identical, and the width of the channel of the TFT switch gradually broadens from the middle to the two terminals of the plurality of laterally arranged switch sets.

Furthermore, the width of the channel of the TFT switch of each of the plurality of switch sets is identical, and the length of the channel of the TFT switch gradually narrows from the middle to the two terminals of the plurality of laterally arranged switch sets.

Furthermore, the conductivity of the switch set linearly strengthens from the middle to the two terminals of the plurality of laterally arranged switch sets.

Furthermore, the volume of the TFT switch in each of the plurality of switch sets is the same.

Furthermore, each of the plurality of switch sets comprises three TFT switches.

Furthermore, the TFT switch is a N-type TFT switch.

According to the present invention a display includes a display panel and a panel driving device. The panel driving device comprises: a source driver chip, comprising a plurality of laterally arranged source driver signal output ports, and being configured to output a source driver signal; a plurality of leads, distributed like a sector; each of the plurality of leads being connected to a source driver signal output port; the length of the lead becoming gradually longer from the middle to two terminals of the plurality of laterally arranged leads; a multiplexer, connected to a plurality of leads, being configured to transmit the source driver signal output by each of the plurality of leads to a plurality of data lines on the display panel, and being configured to adjust the strength of the source driver signal output by each of the plurality of leads if the strength is not unanimous so that the source driver signals with a single strength enters the plurality of data lines.

Furthermore, the multiplexer comprises a plurality of laterally arranged switch sets, and each of the plurality of leads is connected to one of the plurality of switch sets; each of the plurality of switch sets comprises a plurality of laterally arranged TFT switches, each of the plurality of TFT switches is connected to one data line on the display panel so that the source driver signal passes through each of the plurality of leads to the plurality of data lines; the conductivity of each of the plurality of TFT switches in each of the plurality of switch sets is equal; the conductivity of the switch set strengthens from the middle to the two terminals of the plurality of laterally arranged switch sets so that the strength of the source driver signal passing through each of the plurality of data lines in the display panel is equal.

Furthermore, the ratio of width/length of a channel of the TFT switch of the switch set gradually enlarges from the middle to the two terminals of the plurality of laterally arranged switch sets.

Furthermore, the length of the channel of the TFT switch of each of the plurality of switch sets is identical, and the width of the channel of the TFT switch gradually broadens from the middle to the two terminals of the plurality of laterally arranged switch sets.

Furthermore, the width of the channel of the TFT switch of each of the plurality of switch sets is identical, and the length of the channel of the TFT switch gradually narrows from the middle to the two terminals of the plurality of laterally arranged switch sets.

Furthermore, the conductivity of the switch set linearly strengthens from the middle to the two terminals of the plurality of laterally arranged switch sets.

Furthermore, the volume of the TFT switch in each of the plurality of switch sets is the same.

Furthermore, each of the plurality of switch sets comprises three TFT switches.

Furthermore, the TFT switch is a N-type TFT switch.

Compared with conventional technology, a lead at output terminal is connected to a multiplexer in the present invention. Source driver signals with different strengths through the lead are adjusted with the multiplexer to be the source driver signals with a unanimous strength. In other words, the source driver signals at different declining levels in the lead are balanced with the multiplexer and then transmitted to a plurality of data lines. Since the source driver signals with a unanimous strength enter the data line is consistent, the source driver signals in the data line is uniformed, the display of images on the small and medium-sized panel is improved, and the display effect is improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE PREFERRED EMBODIMENTS

These and other objectives of the claimed invention will no doubt become obvious to those of ordinary skill in the art after reading the following detailed description of the preferred embodiment that is illustrated in the various figures and drawings.

An object of the present invention is to propose a display panel driving device to fulfill the tendency of a thinned cellphone using a narrow edge bezel. A small and medium-sized panel mostly adopts the structure of a GOA and a driver chip; that is, the gate driver is integrated onto a display zone. So a source driver chip in charge of a data signal is bonded on the non-display zone. In this condition, it is necessary to adjust the source driver signal in a lead connected to a source driver signal output port of the source driver chip in charge of a data signal.

In other embodiments of the present invention, the dual-side lead routing (two or a plurality of source driver chips) is specifically for a display panel without having the structure of the GOA plus the driver chip. Also, the source driver signal in the lead connected to the source driver signal output port of the plurality of source driver chips is adjusted.

Figure 2:
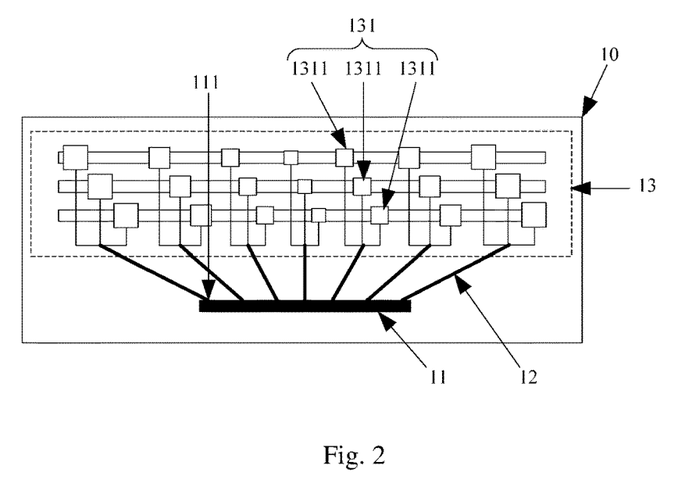
FIG. 2 is a schematic diagram of the structure of a display panel driving device according to one preferred embodiment of the present invention.

Please refer to FIG. 2. FIG. 2 is a schematic diagram of the structure of a display panel driving device 10 according to one preferred embodiment of the present invention. The display panel driving device 10 comprises a source driver chip 11, a plurality of leads 12, and a multiplexer 13.

The source driver chip 11 comprises a plurality of source driver signal output ports 111 to output a source driver signal. The source driver signal output ports 111 are laterally arranged.

The plurality of leads 12 are distributed like a sector. Each of the plurality of leads 12 is connected to each of the plurality of source driver signal output ports 111. The length of the lead 12 becomes gradually longer from the middle to two terminals of the plurality of laterally arranged leads 12.

The plurality of source driver signal output ports 111 on the source driver chip 11 are laterally arranged. Also, each of the plurality of leads 12 is connected to one of the plurality of source driver signal output ports 111. So the connections of the plurality of leads 12 to the plurality of source driver signal output ports 111 are laterally arranged as well.

A plurality of leads 12 are fabricated from the same material. The cross-sectional area of the plurality of leads 12 is the same. The plurality of leads 12 are distributed like a sector so the length of the lead 12 at the two terminals is longer than the length of the lead 12 at the middle; that is, the length of the lead 12 becomes gradually longer from the middle to the two terminals of the plurality of laterally arranged leads 12. According to the resistance calculation equation of $R=\rho(l/S)$, the resistance of the lead 12 at the two terminals of the sector is larger than the resistance of the lead 12 at the middle of the sector. $\rho$ represents the material for the lead 12, l represents the length of the lead 12, and S represents the cross-sectional area of the lead 12. So, the source driver signal transmitted through the lead 12 at the two terminals of the sector declines more greatly, which results in serious distortion of the waveform of the source driver signal transmitted through the lead 12 at the two terminals of the sector. In other words, the strength of the source driver signal output by the output terminal of the lead 12 at the two terminals of the sector is weaker than the strength of the source driver signal output by the output terminal of the lead 12 at the middle of the sector.

The multiplexer 13 is connected to the plurality of leads 12. The multiplexer 13 is used to output the source driver signal to a plurality of data lines on the display panel through each of the plurality of leads 12. Meanwhile, the multiplexer 13 is used to adjust the source driver signals with diverse strengths from the plurality of leads 12 so that the source driver signals with the same strength passes through the plurality of data lines.

An output of the lead 12 is connected to the multiplexer 13. The source driver signals output by the lead 12 arranged from the middle to the two terminals have different strengths. The source driver signals with different strengths are input to the multiplexer 13. Then, the strength of the source driver signals is adjusted to be consistent with the multiplexer 13. Then, the source driver signals output by each of the plurality of leads 12 are transmitted to the plurality data lines.

Compared with prior art, the present disclosure proposes that leads 12 at output terminal is connected to the multiplexer 13. Source driver signals with different strengths through the lead 12 are adjusted with the multiplexer 13 to be the source driver signals with a unanimous strength. In other words, the source driver signals at different declining levels in the lead are balanced with the multiplexer and then transmitted to a plurality of data lines. Since the source driver signals with a unanimous strength enter the data line is consistent, the source driver signals in the data line is uniformed, the display of images on the small and medium-sized panel is improved, and the display effect is improved.

The multiplexer 13 comprises a plurality of laterally arranged switch sets 131. Each of the plurality of leads 12 is connected to one of the plurality of switch sets 131.

Each of the plurality of switch sets 131 comprises a plurality of laterally arranged TFT switches 1311. The TFT switch 1311 is an N-type TFT switch. For example, each of the plurality of switch sets 131 comprises three laterally arranged TFT switches 1311 in this embodiment. In another embodiment, each of the plurality of switch sets 131 comprises two, four, five, or more laterally arranged TFT switches 1311. In addition, the volume of the TFT switch 1311 in each of the plurality of switch sets 131 is the same.

In another embodiment, the volume of the TFT switch 1311 in each of the plurality of switch sets 131 may be different.

Each of the plurality of TFT switches 1311 is connected to one data line on the display panel so that the source driver signals passes through each of the plurality of leads 12 to the plurality of data lines.

The conductivity of each of the plurality of TFT switches 1311 in each of the plurality of switch sets 131 is equal. The conductivity of the switch set 131 strengthens from the middle to the two terminals of the plurality of laterally arranged switch sets 131 so that the strength of the source driver signal passing through each of the plurality of data lines in the display panel can be equal all the way.

For example, the conductivity of the three TFT switches 1311 in the first switch set 131 as shown in FIG. 2 on the left is equal; the conductivity of the three TFT switches 1311 in the second switch set 131 as shown in FIG. 2 at the left side is equal. However, the conductivity of the three TFT switches 1311 in the first switch set 131 is stronger than the conductivity of the three TFT switches 1311 in the second switch set 131 as shown in FIG. 2 at the left side.

The strength of the source driver signal gets weaker from the middle to the two terminals of the laterally arranged leads 12 after the source driver signal enters the lead 12. The conductivity of the switch set 131 gets stronger from the middle to the two terminals of the laterally arranged switch sets 131 after the source driver signal enters the multiplexer 13. The increase in the strength of the conductivity of the switch set 131 at the two terminals balances and compensates the distortion of the source driver signal in the lead 12. Therefore, the strength of the source driver signal output by the multiplexer 13 is consistent.

In this embodiment, that the conductivity of the first switch set 131 strengthens from the middle to the two terminals of the plurality of laterally arranged first switch sets 131 is actualized through the ratio of W/L of the channel of the TFT switch. Concretely, the ratio of W/L of the channel of the TFT switch 1311 of the first switch set 131 gradually enlarges from the middle to the two terminals of the plurality of laterally arranged first switch sets 131.

The TFT switch comprises a gate, a source, a drain, and a channel. The channel is connected to a source and a drain. The distance between the source and the drain is the length (L) of the channel. The width (W) of the channel is the width which is at the same plane with that the source and drain and is vertical to a straight line from the source to the drain. When the width/length (W/L) ratio of the channel is higher, the conductivity of the TFT switch 1311 is stronger. Otherwise, the conductivity of the TFT switch 1311 is weaker when the W/L ratio of the channel is lower.

In this embodiment, the W/L value of the TFT switch 1311 at the two terminals is enlarged so the conductivity of the TFT switch 1311 at the two terminals is strengthened. Signals at the two terminals of the TFT switch 1311 is distorted less, and a signal at the middle of the TFT switch 1311 is distorted more. However, signals at the two terminals of the lead 12 are distorted more, and a signal at the middle of the lead 12 is distorted less. In the way, the distortion of the signals gets balanced.

Figure 3:
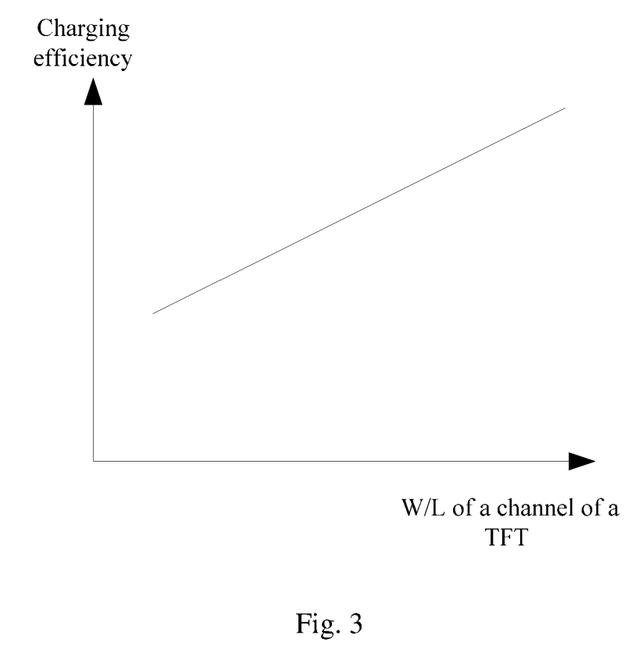
FIG. 3 shows a relationship of the ratio of W/L of the channel of the TFT switch in the driving device of the display panel and the charging efficiency of the pixel.

FIG. 3 shows a relationship of the ratio of W/L of the channel of the TFT switch in the driving device of the display panel and the charging efficiency of the pixel. As the ratio of W/L of the channel of the TFT switch gets larger gradually, the charging efficiency of the pixel gets better gradually.

The variation of the width/length is realized with two methods as follows:

The length of the channel of the TFT switch 1311 of each of the plurality of switch sets 131 is identical in one preferred embodiment of the present invention. From the middle of the plurality of laterally arranged switch sets 131 to the two terminals, the width of the channel of the TFT switch 1311 gradually broadens.

The width of the channel of the TFT switch 1311 of each of the plurality of switch sets 131 is identical in another preferred embodiment of the present invention. From the middle of the plurality of laterally arranged switch sets 131 to the two terminals, the length of the channel of the TFT switch 1311 is gradually narrowed.

The conductivity of the switch set 131 strengthens from the middle to the two terminals of the plurality of laterally arranged switch sets 131 in a linear manner.

Figure 4:
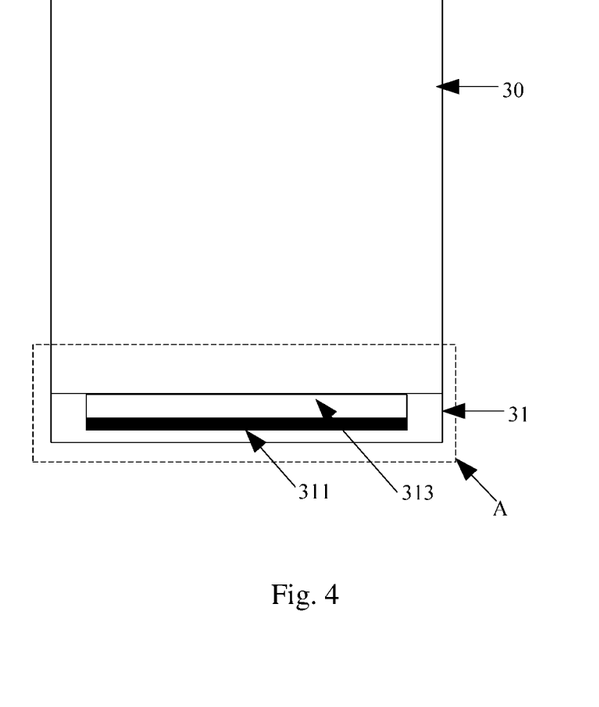
FIG. 4 is a schematic diagram of the structure of a display device.
Figure 5:
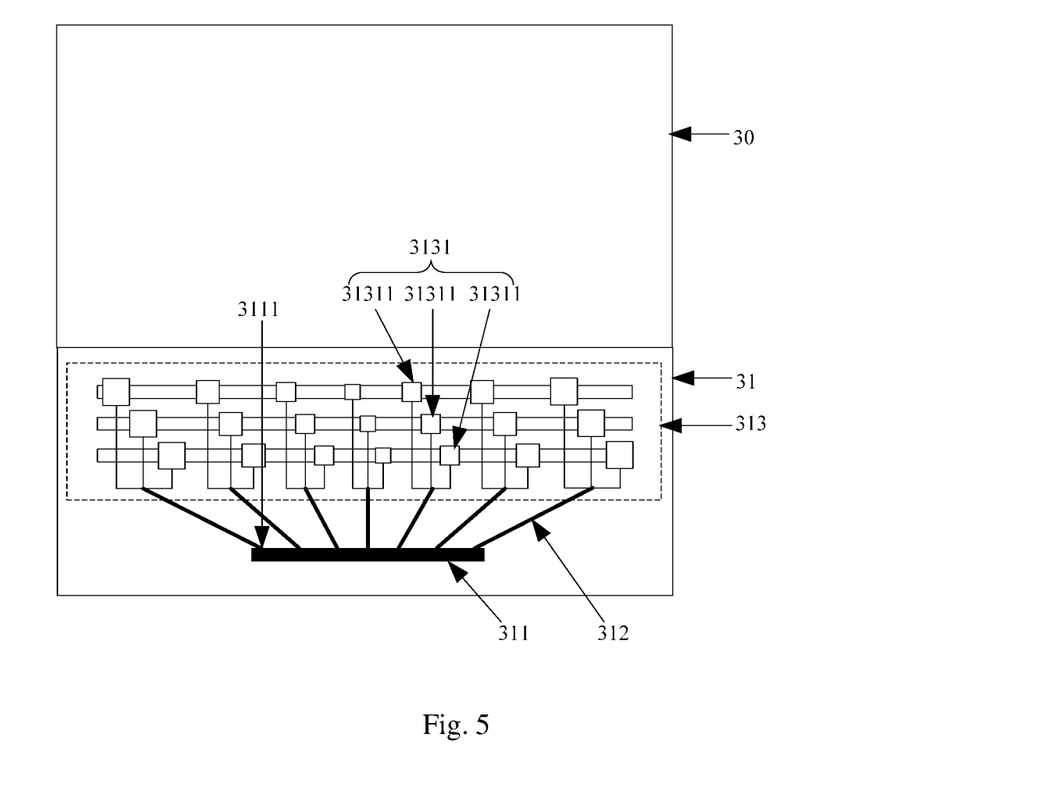
FIG. 5 is a schematic diagram of the structure of a zoomed A zone according to the embodiment of the present invention.

Please refer to FIG. 4 and FIG. 5. FIG. 4 is a schematic diagram of the structure of a display device; FIG. 5 is a schematic diagram of the structure of a zoomed A zone according to the embodiment of the present invention.

A display device is further proposed by the present invention. The display device comprises a display panel 30 and a display panel driving device 31. The display panel driving device 31 may be any one of the display panel driving device 31 introduced in the above-mentioned embodiments.

The display panel driving device 31 comprises a source driver chip 311, a plurality of leads 312, and a multiplexer 313.

The source driver chip 311 comprises a plurality of source driver signal output ports 3111 to output a source driver signal.

The plurality of leads 312 are distributed like a sector. Each of the plurality of leads 312 is connected to one of the plurality of source driver signal output ports 3111. The length of the lead 312 becomes gradually longer from the middle of the plurality of leads 312 to two terminals of the plurality of leads 312. The plurality of leads 312 are laterally arranged.

The plurality of source driver signal output ports 3111 on the source driver chip 311 are laterally arranged. Also, each of the plurality of leads 312 is connected to one of the plurality of source driver signal output ports 3111. So the connections of the plurality of leads 312 to the plurality of source driver signal output ports 3111 are laterally arranged as well.

A plurality of leads 312 are fabricated from the same material. The cross-sectional area of the plurality of leads 312 is the same. The plurality of leads 312 are distributed like a sector so the length of the lead 312 at the two terminals is longer than the length of the lead 312 at the middle; that is, the length of the lead 312 becomes gradually longer from the middle to the two terminals of the plurality of laterally arranged leads 312. According to the resistance calculation equation of $R=\rho(l/S)$, the resistance of the lead 312 at the two terminals of the sector is larger than the resistance of the lead 312 at the middle of the sector. $\rho$ represents the material for the lead 312, l represents the length of the lead 312, and S represents the cross-sectional area of the lead 312. So, the source driver signal transmitted through the lead 312 at the two terminals of the sector declines more greatly, which results in serious distortion of the waveform of the source driver signal transmitted through the lead 312 at the two terminals of the sector. In other words, the strength of the source driver signal output by the output terminal of the lead 312 at the two terminals of the sector is weaker than the strength of the source driver signal output by the output terminal of the lead 312 at the middle of the sector.

The multiplexer 313 is connected to a plurality of leads 312. The source driver signal output by each of the plurality of leads 312 is transmitted to a plurality of data lines in the display panel 30 with the multiplexer 313. Also, the strength of the source driver signal output by each of the plurality of leads 312 is adjusted if the strength is not unanimous so that the source driver signals with a single strength enters the plurality of data lines.

Specifically, the output terminal of the lead 312 is connected to the multiplexer 313. The source driver signals output by the lead 312 arranged from the middle to the two terminals have different strengths. The source driver signals with different strengths are input to the multiplexer 313. Then, the strength of the source driver signals is adjusted to be consistent with the multiplexer 313. Then, the source driver signals output by each of the plurality of leads 312 are transmitted to the plurality data lines.

The multiplexer 313 comprises a plurality of switch sets 3131 which are laterally arranged. Each of the plurality of leads 312 is connected to one of the plurality of switch sets 3131.

Each of the plurality of switch sets 3131 comprises a plurality of laterally arranged TFT switches 31311. The TFT switch 31311 is an N-type TFT (NTFT) switch. For example, each of the plurality of switch sets 3131 comprises three laterally arranged TFT switches 31311 in this embodiment. In another embodiment, each of the plurality of switch sets 3131 comprises two, four, five, or more laterally arranged TFT switches 31311. In addition, the volume of the TFT switch 31311 in each of the plurality of switch sets 3131 is the same. In another embodiment, the volume of the TFT switch 31311 in each of the plurality of switch sets 3131 may be different.

Each of the plurality of TFT switches 31311 is connected to one data line on the display panel 30 so that the source driver signals passes through each of the plurality of leads 312 to the plurality of data lines.

The conductivity of each of the plurality of TFT switches 31311 in each of the plurality of switch sets 3131 is equal. The conductivity strengths from the middle to the two terminals of the plurality of laterally arranged switch sets 3131 so that the strength of the source driver signal passing through each of the plurality of data lines in the display panel 30 can be equal all the way.

The strength of the source driver signal gets weaker from the middle to the two terminals of the laterally arranged leads 12 after the source driver signal enters the lead 12. The conductivity of the switch set 131 gets stronger from the middle to the two terminals of the laterally arranged switch sets 131 after the source driver signal enters the multiplexer 13. The increase in the strength of the conductivity of the switch set 131 at the two terminals balances and compensates the distortion of the source driver signal in the lead 12. Therefore, the strength of the source driver signal output by the multiplexer 13 is consistent.

In this embodiment, that the conductivity of the switch set 3131 strengthens from the middle to the two terminals of the plurality of laterally arranged switch sets 3131 is actualized through the ratio of W/L of the channel of the TFT switch. Concretely, the ratio of W/L of the channel of the TFT switch 31311 of the switch set 3131 gradually enlarges from the middle to the two terminals of the plurality of laterally arranged first switch sets 3131.

In this embodiment, the W/L value of the TFT switch 31311 at the two terminals is enlarged so the conductivity of the TFT switch 31311 at the two terminals is strengthened. Signals at the two terminals of the TFT switch 31311 is distorted less, and a signal at the middle of the TFT switch 31311 is distorted more. However, signals at the two terminals of the lead 312 are distorted more, and a signal at the middle of the lead 312 is distorted less. In the way, the distortion of the signals gets balanced.

To sum up, the display uniformity of images shown on the small and medium-sized panel is improved as well as display effect according to the present invention.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A driving device for a display panel, comprising:
   a source driver chip, comprising a plurality of laterally arranged source driver signal output ports, and being configured to output a source driver signal;
   a plurality of leads, distributed in a sector; each of the plurality of leads being connected to a source driver signal output port; the length of the lead becoming longer from the middle to two terminals of the plurality of laterally arranged leads;
   a multiplexer, connected to a plurality of leads, being configured to transmit the source driver signal output by each of the plurality of leads to a plurality of data lines on the display panel, and being configured to adjust the strength of the source driver signal output by each of the plurality of leads when the strength is not unanimous so that the source driver signals with a single strength enters the plurality of data lines,
   wherein the multiplexer comprises a plurality of laterally arranged switch sets, and each of the plurality of leads is connected to one of the plurality of switch sets; each of the plurality of switch sets comprises a plurality of laterally arranged TFT switches, each of the plurality of TFT switches is connected to one data line on the display panel so that the source driver signal passes through each of the plurality of leads to the plurality of data lines; the conductivity of each of the plurality of TFT switches in each of the plurality of switch sets is equal; the ratio of width/length of a channel of the TFT switch of the switch set enlarges from the middle to the two terminals of the plurality of laterally arranged switch sets; the conductivity of the switch set linearly strengthens from the middle to the two terminals of the plurality of laterally arranged switch sets, so that the strength of the source driver signal passing through each of the plurality of data lines in the display panel is equal.

2. A driving device for a display panel, comprising:
   a source driver chip, comprising a plurality of laterally arranged source driver signal output ports, and being configured to output a source driver signal;
   a plurality of leads, distributed in a sector; each of the plurality of leads being connected to a source driver signal output port; the length of the lead becoming longer from the middle to two terminals of the plurality of laterally arranged leads;
   a multiplexer, connected to a plurality of leads, being configured to transmit the source driver signal output by each of the plurality of leads to a plurality of data lines on the display panel, and being configured to adjust the strength of the source driver signal output by each of the plurality of leads when the strength is not unanimous so that the source driver signals with a single strength enters the plurality of data lines.

3. The driving device for the display panel of claim 2, wherein the multiplexer comprises a plurality of laterally arranged switch sets, and each of the plurality of leads is connected to one of the plurality of switch sets;
   each of the plurality of switch sets comprises a plurality of laterally arranged TFT switches, each of the plurality of TFT switches is connected to one data line on the display panel so that the source driver signal passes through each of the plurality of leads to the plurality of data lines;
   the conductivity of each of the plurality of TFT switches in each of the plurality of switch sets is equal; the conductivity of the switch set strengthens from the middle to the two terminals of the plurality of laterally arranged switch sets so that the strength of the source driver signal passing through each of the plurality of data lines in the display panel is equal.

4. The driving device for the display panel of claim 3, wherein the ratio of width/length of a channel of the TFT switch of the switch set enlarges from the middle to the two terminals of the plurality of laterally arranged switch sets.

5. The driving device for the display panel of claim 4, wherein the length of the channel of the TFT switch of each of the plurality of switch sets is identical, and the width of the channel of the TFT switch broadens from the middle to the two terminals of the plurality of laterally arranged switch sets.

6. The driving device for the display panel of claim 4, wherein the width of the channel of the TFT switch of each of the plurality of switch sets is identical, and the length of the channel of the TFT switch narrows from the middle to the two terminals of the plurality of laterally arranged switch sets.

7. The driving device for the display panel of claim 3, wherein the conductivity of the switch set linearly strengthens from the middle to the two terminals of the plurality of laterally arranged switch sets.

8. The driving device for the display panel of claim 7, wherein the volume of the TFT switch in each of the plurality of switch sets is the same.

9. The driving device for the display panel of claim 8, wherein each of the plurality of switch sets comprises three TFT switches.

10. The driving device for the display panel of claim 9, wherein the TFT switch is a N-type TFT switch.

11. A display comprising a display panel and a driving device for the display panel, the panel driving device comprising:
    a source driver chip, comprising a plurality of laterally arranged source driver signal output ports, and being configured to output a source driver signal;
    a plurality of leads, distributed in a sector; each of the plurality of leads being connected to a source driver signal output port; the length of the lead becoming longer from the middle to two terminals of the plurality of laterally arranged leads;
    a multiplexer, connected to a plurality of leads, being configured to transmit the source driver signal output by each of the plurality of leads to a plurality of data lines on the display panel, and being configured to adjust the strength of the source driver signal output by each of the plurality of leads when the strength is not unanimous so that the source driver signals with a single strength enters the plurality of data lines.

12. The display of claim 11, wherein the multiplexer comprises a plurality of laterally arranged switch sets, and each of the plurality of leads is connected to one of the plurality of switch sets;
  each of the plurality of switch sets comprises a plurality of laterally arranged TFT switches, each of the plurality of TFT switches is connected to one data line on the display panel so that the source driver signal passes through each of the plurality of leads to the plurality of data lines;
  the conductivity of each of the plurality of TFT switches in each of the plurality of switch sets is equal; the conductivity of the switch set strengthens from the middle to the two terminals of the plurality of laterally arranged switch sets so that the strength of the source driver signal passing through each of the plurality of data lines in the display panel is equal.

13. The display of claim 12, wherein the ratio of width/length of a channel of the TFT switch of the switch set enlarges from the middle to the two terminals of the plurality of laterally arranged switch sets.

14. The display of claim 13, wherein the length of the channel of the TFT switch of each of the plurality of switch sets is identical, and the width of the channel of the TFT switch broadens from the middle to the two terminals of the plurality of laterally arranged switch sets.

15. The display of claim 13, wherein the width of the channel of the TFT switch of each of the plurality of switch sets is identical, and the length of the channel of the TFT switch narrows from the middle to the two terminals of the plurality of laterally arranged switch sets.

16. The display of claim 12, wherein the conductivity of the switch set linearly strengthens from the middle to the two terminals of the plurality of laterally arranged switch sets.

17. The display of claim 16, wherein the volume of the TFT switch in each of the plurality of switch sets is the same.

18. The display of claim 17, wherein each of the plurality of switch sets comprises three TFT switches.

19. The display of claim 18, wherein the TFT switch is a N-type TFT switch.

* * * * *